United States Patent

Mishima

(10) Patent No.: US 9,142,706 B2
(45) Date of Patent: Sep. 22, 2015

(54) METHOD OF MANUFACTURING SOLAR CELL

(71) Applicant: Sanyo Electric Co., Ltd., Moriguchi, Osaka (JP)

(72) Inventor: Takahiro Mishima, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 73 days.

(21) Appl. No.: 13/743,417

(22) Filed: Jan. 17, 2013

(65) Prior Publication Data

US 2013/0137211 A1 May 30, 2013

Related U.S. Application Data

(63) Continuation of application No. PCT/JP2011/067216, filed on Jul. 28, 2011.

(30) Foreign Application Priority Data

Jul. 28, 2010 (JP) .................................. 2010-168852

(51) Int. Cl.
*H01L 21/00* (2006.01)
*H01L 31/18* (2006.01)
*H01L 31/0216* (2014.01)
(Continued)

(52) U.S. Cl.
CPC .......... *H01L 31/18* (2013.01); *H01L 31/02167* (2013.01); *H01L 31/02168* (2013.01); *H01L 31/022441* (2013.01); *H01L 31/0747* (2013.01); *H01L 31/1804* (2013.01); *Y02E 10/547* (2013.01)

(58) Field of Classification Search
CPC . H01L 31/18; H01L 31/1804; H01L 31/0747; H01L 31/02167; H01L 31/022441; H01L 31/02168; Y02E 10/547
USPC ............................................................ 438/98
See application file for complete search history.

(56) References Cited

U.S. PATENT DOCUMENTS 4,879,251 A * 11/1989 Kruehler et al. ................. 438/80
4,956,023 A * 9/1990 Tsuge et al. .................... 136/244
6,426,235 B1 * 7/2002 Matsushita et al. ............. 438/22
(Continued)

FOREIGN PATENT DOCUMENTS

EP            2530729 A1   12/2012
JP         61-006828 A     1/1986
(Continued)

*Primary Examiner* — Jarrett Stark
(74) *Attorney, Agent, or Firm* — Marvin A. Motsenbocker; Mots Law, PLLC

(57) ABSTRACT

A second semiconductor layer is formed to cover a first principle surface of a semiconductor substrate including a insulating layer formed on the first principle surface. A portion of the second semiconductor layer formed on the insulating layer is partially removed by etching using a first etchant whose etching rate is higher for the second semiconductor layer than for the insulating layer. A portion of the insulating layer is removed by etching, through the removed portion of the second semiconductor layer, using a second etchant whose etching rate for the insulating layer is higher than that for the second semiconductor layer, thereby exposing a part of the first semiconductor layer. Electrodes are formed on the exposed part of the first semiconductor layer and the second semiconductor layer, respectively.

9 Claims, 8 Drawing Sheets

(51) Int. Cl.
*H01L 31/0224* (2006.01)
*H01L 31/0747* (2012.01)

(56) References Cited

U.S. PATENT DOCUMENTS

| | | | |
|---|---|---|---|
| 2003/0160304 A1* | 8/2003 | Ohmi et al. | 257/627 |
| 2008/0061293 A1* | 3/2008 | Ribeyron et al. | 257/53 |
| 2008/0257399 A1* | 10/2008 | Wong et al. | 136/246 |
| 2010/0163828 A1* | 7/2010 | Tu | 257/3 |
| 2012/0012179 A1 | 1/2012 | Asaumi et al. | |

FOREIGN PATENT DOCUMENTS

| | | |
|---|---|---|
| JP | 11-026427 A | 1/1999 |
| JP | 2008-517451 A | 5/2008 |
| JP | 2008-529265 A | 7/2008 |
| JP | 2009-088098 A | 4/2009 |
| JP | 2010-080887 A | 4/2010 |
| WO | 2010/113750 A1 | 10/2010 |
| WO | 2011/093329 A1 | 8/2011 |

* cited by examiner

US 9,142,706 B2

METHOD OF MANUFACTURING SOLAR CELL

CROSS REFERENCE TO RELATED APPLICATIONS

This application is a continuation application of International Application No. PCT/JP2011/067216, filed on Jul. 28, 2011, entitled "METHOD OF MANUFACTURING SOLAR CELL", which claims priority based on Article 8 of Patent Cooperation Treaty from prior Japanese Patent Applications No. 2010-168852, filed on Jul. 28, 2010, the entire contents of which are incorporated herein by reference.

BACKGROUND OF THE INVENTION

1. Field of the Invention

This disclosure relates to a method of manufacturing a solar cell. In particular, this disclosure relates to a method of manufacturing a back contact solar cell.

2. Description of Related Art

Conventionally, there has been known so-called a back contact solar cell in which p-type and n-type semiconductor regions are formed on a back surface side of a solar cell (for example, following patent document 1). In this back contact solar cell, there is no need to provide an electrode on a light-receiving surface side. For this reason, this back contact solar cell can increase light receiving efficiency, and accordingly can achieve higher power generation efficiency. Also, connection of solar cells with a wiring material can be performed only on the back surface side. Hence, a wide wiring material can be used. Accordingly, a voltage drop caused by wiring multiple solar cells with a wiring material can be prevented.

In this back contact solar cell, it is necessary to form multiple kinds of semiconductor junctions on the back surface of the semiconductor substrate. Specifically, a p-type semiconductor layer and an n-type semiconductor layer needs to be formed on the back surface of the semiconductor substrate. To this end, a concerning issue is how to form the p-type semiconductor layer and the n-type semiconductor layer on the back surface of the semiconductor substrate.

For example, Patent document 1 discloses the following method as a method of manufacturing a back contact solar cell. To be more precise, first, as illustrated in FIG. 14, in-junction layer 101 being a laminate of i-type semiconductor layer 101$i$ and n-type semiconductor layer 101$n$, and cover layer 102 are formed in this order on a back surface of n-type amorphous silicon substrate 100. Thereafter, portions of cover layer 102 are removed by an etching method.

Next, as illustrated in FIG. 15, cover layer 102 whose one portion is etched is used as a mask to remove portions of in-junction layer 101 by an etching method. After that, as illustrated in FIG. 16, ip-junction layer 104 being a laminate of i-type semiconductor layer 104$i$ and p-type semiconductor layer 104$p$ is formed. Then, cover layer 102 is removed by etching to expose portions of in-junction layer 101 covered by cover layer 102. Finally, an n-side electrode is formed on in-junction layer 101 and a p-side electrode is formed on ip-junction layer 104, so that a back contact solar cell is completed.

Patent Document: JP-A 2010-80887

SUMMARY OF THE INVENTION

The method of manufacturing a back contact solar cell disclosed in patent document 1 requires a long time to remove cover layer 102 by etching. Thus, there is a problem that a long time is required for manufacturing a back contact solar cell. In addition, there is also a problem that it is difficult to surely remove cover layer 102 by etching.

An embodiment of the invention has been made in view of the foregoing points, and an objective thereof is to provide a method capable of easily manufacturing a back contact solar cell.

In a method of manufacturing a solar cell according to an aspect of the invention, a semiconductor substrate is prepared which has first and second principle surfaces, where a first semiconductor region having first conductivity is formed on a portion of the first principle surface and an insulating layer is further formed to cover the first semiconductor region. A second semiconductor layer having second conductivity is formed to cover the first principle surface including a surface of the insulating layer. A portion of the second semiconductor layer located on the insulating layer is partially removed by etching with a first etchant whose etching rate is higher for the second semiconductor layer than for the insulating layer. A portion of the insulating layer is removed by etching, from above the second semiconductor layer that has the partially removed portion removed by the etching, with a second etchant whose etching rate is higher for the insulating layer than for the second semiconductor layer, to expose the first semiconductor region. Then, an electrode forming step of forming an electrode on each of the first semiconductor region and the second semiconductor layer is performed.

The aspect of the invention can provide a method capable of easily manufacturing a back contact solar cell.

DETAILED DESCRIPTION OF EMBODIMENTS

Figure 1:
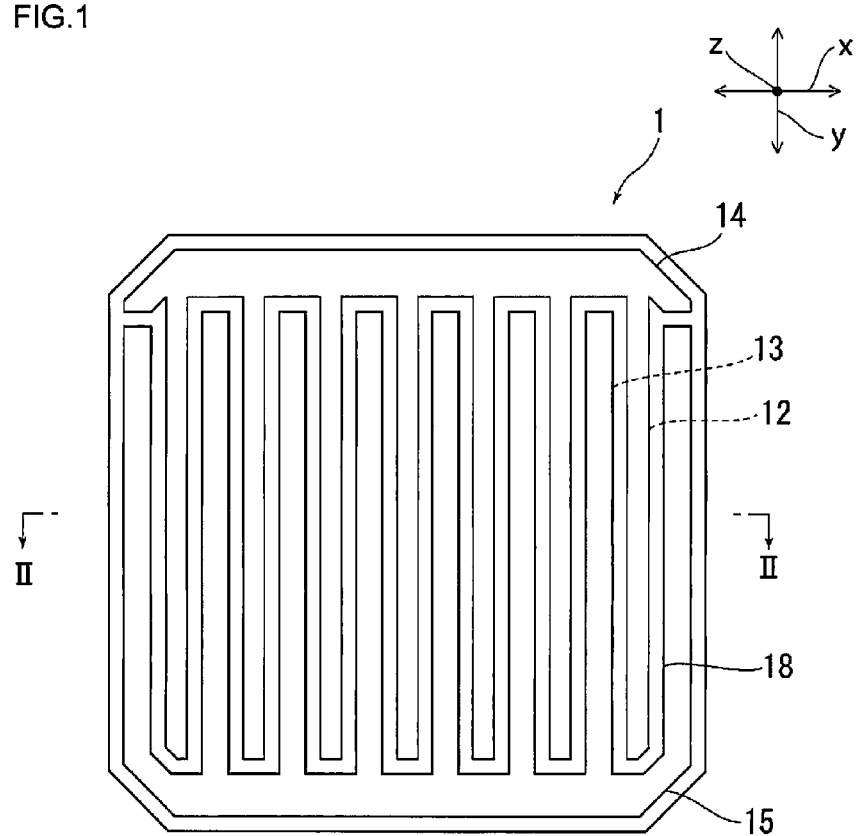
FIG. 1 is a schematic plan view of a solar cell according to a first embodiment.

Hereinafter, one example of preferred embodiments of the invention is described. However, the following embodiments are only exemplary. The invention is not limited to the following embodiments at all.

Also, in each drawing referred in the embodiments or the like, members having substantially same functions are referred by same reference numerals. In addition, drawings referred in the embodiments or the like are merely schematically shown and proportions of sizes of an object which are depicted in the drawings may be different from actual proportions of sizes of the object. In addition, there may be also included portions where proportions of sizes or the like of the object in the drawings are different with respect to one another. Thus, specific proportions of sizes and the like of the object should be judged by referring to the description below.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

<<First Embodiment>>

(Configuration of Solar Cell 1)

Figure 2:
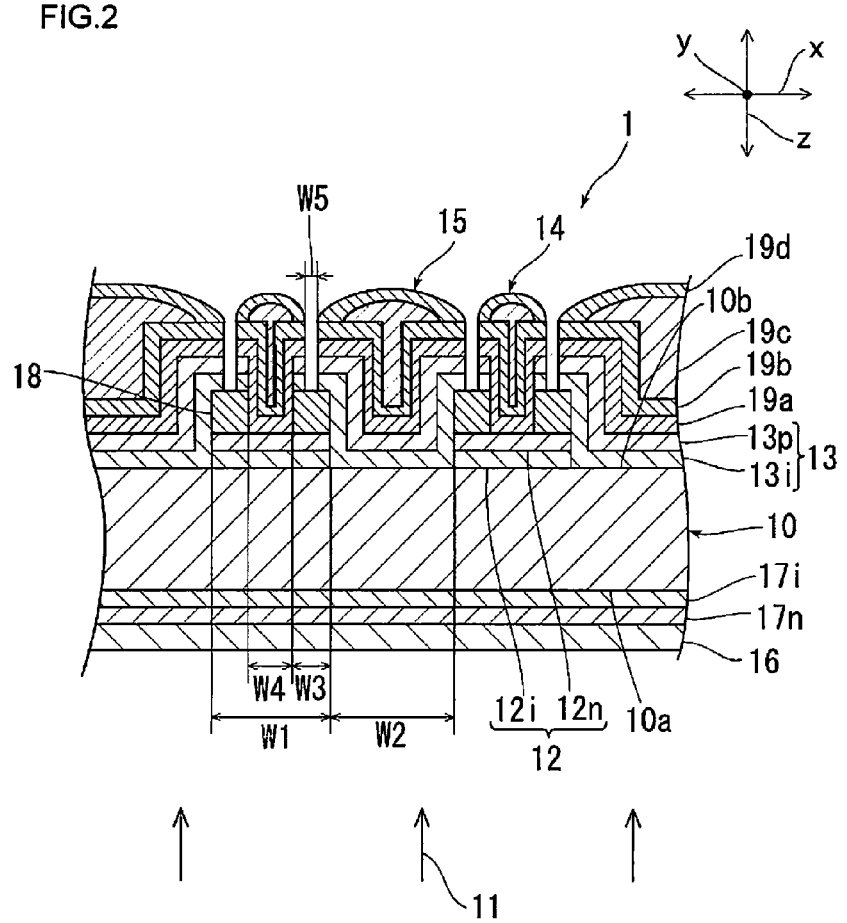
FIG. 2 is a schematic cross-sectional view taken along the line II-II in FIG. 1.

First, the configuration of solar cell 1 which is manufactured in the embodiment is described in detail by referring to FIGS. 1 and 2.

Solar cell 1 is a back contact solar cell. Note that in a case where single solar cell 1 of the embodiment cannot provide a sufficient output, plural solar cells 1 may be connected by a wiring material to be used as a solar cell module.

As illustrated in FIG. 2, solar cell 1 includes semiconductor substrate 10. Semiconductor substrate 10 has light-receiving surface 10a as a second principle surface and back surface 10b as a first principle surface. Semiconductor substrate 10 generates carriers by receiving light on light-receiving surface 10a. Here, the carrier means holes and electrons which are generated when light is absorbed by semiconductor substrate 10.

Semiconductor substrate 10 is formed of an n-type or p-type crystalline semiconductor substrates. For example, a specific example of the crystalline semiconductor substrate includes a crystalline silicon substrate such as a single crystal silicon substrate, or a polycrystalline silicon substrate.

Note that a semiconductor substrate may be formed of a semiconductor substrate other than a crystalline semiconductor substrate. For example, a compound semiconductor substrate including GaAs or InP may be used in place of semiconductor substrate 10. Hereinafter, in the embodiment, an example in which semiconductor substrate 10 is formed of an n-type single crystal silicon substrate is described.

I-type amorphous semiconductor layer 17i including a substantially intrinsic amorphous semiconductor (hereinafter, an intrinsic semiconductor is referred to as "i-type semiconductor") is formed on light-receiving surface 10a of semiconductor substrate 10. Specifically, in the embodiment, i-type amorphous semiconductor layer 17i is formed of i-type amorphous silicon containing hydrogen. A thickness of i-type amorphous semiconductor layer 17i is not particularly limited as long as the thickness is to such a degree that of i-type amorphous semiconductor layer 17i makes substantially no contribution to power generation. The thickness of i-type amorphous semiconductor layer 17i may be, for example, approximately a several Å to 250 Å.

Note that an "amorphous semiconductor" in the invention includes a microcrystal semiconductor. The microcrystal semiconductor means a semiconductor in which the average particle diameter of semiconductor crystals deposited in the amorphous semiconductor is in a range of 1 nm to 50 nm.

An n-type amorphous semiconductor layer 17n having a conductivity same as that of semiconductor substrate 10 is formed on i-type amorphous semiconductor layer 17i. N-type amorphous semiconductor layer 17n is amorphous semiconductor layer having an n-type conductivity into which n-type dopant is doped. Specifically, in the embodiment, n-type amorphous semiconductor layer 17n is made of n-type amorphous silicon containing hydrogen. A thickness of n-type amorphous semiconductor layer 17n is not particularly limited. The thickness of n-type amorphous semiconductor layer 17n may be, for example, approximately 20 Å to 500 Å.

Insulating layer 16 having both functions as a reflection prevention film and a protective film is formed on n-type amorphous semiconductor layer 17n. For example, insulating layer 16 maybe be formed of silicon oxide, silicon nitride, silicon oxynitride, or the like. A thickness of insulating layer 16 may be set as needed according to the reflection prevention characteristic of the reflection prevention film. For example, the thickness of insulating film 16 may be approximately 80 nm to 1 μm.

A laminated structure of foregoing i-type amorphous semiconductor layer 17i, n-type amorphous semiconductor layer 17n, and insulating layer 16 has a function as a passivation layer of semiconductor substrate 10 and a function as a reflection prevention film.

IN laminate 12 and IP laminate 13 are formed on back surface 10b of semiconductor substrate 10. As illustrated in FIG. 1, each of IN laminate 12 and IP laminate 13 is formed in a comb-teeth shape. IN laminate 12 and IP laminate 13 are formed to be interleaved with each other. For this reason, on back surface 10b, IN laminate 12 and IP laminate 13 are alternately arranged along vertical direction x orthogonal to intersection width direction y. IN laminated boy 12 and IP laminate 13 which are adjacent to each other in direction x are in contact with each other. In other words, in the embodiment, IN laminate 12 and IP laminate 13 substantially entirely cover back surface 10b. Note that width W1 of IN laminate 12 (see FIG. 2) and gap W2 of IN laminate 12 in direction x may be respectively set to approximately 100 μm to 1.5 mm, for example. Width W1 and gap W2 may be equal to or different from each other.

IN laminate 12 is a laminate including i-type amorphous semiconductor layer 12i formed on back surface 10b and n-type amorphous semiconductor layer 12n formed on i-type amorphous semiconductor layer 12i. As similar to foregoing i-type amorphous semiconductor layer 17i, i-type amorphous semiconductor layer 12i is made of i-type amorphous silicon containing hydrogen. A thickness of i-type amorphous semiconductor layer 12i is not particularly limited as long as the thickness is in such a degree that it does not substantially affect power generation. The thickness of i-type amorphous semiconductor layer 12i may be set to, for example, approximately a several Å to 250 Å.

As similar to foregoing n-type amorphous semiconductor layer 17n, n-type amorphous semiconductor layer 12n has n-type dopant doped therein and thus has an n-type conductivity same as that of semiconductor substrate 10. Specifically, in the embodiment, n-type amorphous semiconductor layer 12n is made of n-type amorphous silicon containing hydrogen. A thickness of n-type amorphous semiconductor layer 12n is not particularly limited. The thickness of n-type amorphous semiconductor layer 12n may be set to, for example, approximately 20 Å to 500 Å.

Insulating layer 18 is formed on both end portions of IN laminate 12 in direction x, except for a center portion thereof. The center portion of IN laminate 12 in direction x is exposed from insulating layer 18. Width W3 of insulating layer 18 in direction x is not particularly limited, and may be, for example, approximately one third of width W1. Gap W4 between insulating layers 18 in direction x is also not particularly limited, and may be, for example, approximately one third of width W1.

A material of insulating layer 18 is not particularly limited. For example, insulating layer 18 may be formed of silicon oxide, silicon nitride, silicon oxynitride, or the like. Among them, it is preferable that insulating layer 18 be formed of silicon nitride. Also, it is preferable that insulating layer 18 contain hydrogen.

IP laminate 13 is formed to extend over a portion of back surface 10b exposed from IN laminate 12 and also an end portion of insulating layer 18. Thus, both end portions of IP laminate 13 overlap with IN laminate 12 in height direction z.

IP laminate 13 is a laminate including i-type amorphous semiconductor layer 13i formed on back surface 10b and p-type amorphous semiconductor layer 13p formed on i-type amorphous semiconductor layer 13i.

I-type amorphous semiconductor layer 13i is made of i-type amorphous silicon containing hydrogen. A thickness of i-type amorphous semiconductor layer 13i is not particularly limited as long as the thickness is in such a degree that it does not substantially affect power generation. The thickness of i-type amorphous semiconductor layer 13i may be, for example, approximately a several Å to 250 Å.

P-type amorphous semiconductor layer 13p is an amorphous semiconductor layer having a p-type conductivity into which p-type dopant is doped. Specifically, in the embodiment, p-type amorphous semiconductor layer 13p is made of p-type amorphous silicon containing hydrogen. A thickness of p-type amorphous semiconductor layer 13p is not particularly limited. The thickness of p-type amorphous semiconductor layer 13p may be, for example, approximately 20 Å to 500 Å.

In this manner, the embodiment has a structure in which i-type amorphous semiconductor layer 13i with a thickness in such a degree that it does not substantially affect power generation is provided between crystalline semiconductor substrate 10 and p-type amorphous semiconductor layer 13p. By employing such a structure of the embodiment, recombination of carriers in a junction interface between semiconductor substrate 10, IP laminate 13, and IP laminate 12 can be suppressed. As a result, photoelectric conversion efficiency can be improved.

Note that it is preferable that each of amorphous semiconductor layers 17, 12, 13 should contain hydrogen.

N-side electrode 14 to collect electrons is formed on n-type amorphous semiconductor layer 12n. On the other hand, p-side electrode 15 to collect holes is formed on p-type amorphous semiconductor layer 13p. P-side electrode 15 and n-side electrode 14 are electrically insulated from each other. Note that gap W5 between n-side electrode 14 and p-side electrode 15 on insulating layer 18 may be set to one third of width W3, for example.

As described above, in the embodiment, each of IN laminate 12 and IP laminate 13 is formed in a comb-teeth shape. For this reason, each of n-side electrode 14 and p-side electrode 15 is formed in a comb-teeth shape with a bus bar and multiple fingers. Of course, each of n-side electrode 14 and p-side electrode 15 may be a, so-called, bas bar-less type electrode without a bas bar, which is configured of only multiple fingers.

Each of n-side electrode 14 and p-side electrode 15 is not particularly limited as long as it can collect carriers. In the embodiment, each of n-side electrode 14 and p-side electrode 15 is formed of a laminate of first to fourth conductive layers 19a to 19d.

First conductive layer 19a may be formed of, for example, TCO (Transparent conductive Oxide) such as ITO (Indium Tin Oxide). Specifically, in the embodiment, first conductive layer 19a is formed of ITO. A thickness of first conductive layer 19a may be set to approximately 50 to 100 nm.

Second to fourth conductive layers 19b to 19d may be formed of, for example, metal such as Cu or an alloy. Specifically, in the embodiment, each of second and third conductive layers 19b, 19c is formed of Cu. Fourth conductive layer 19d is formed of Sn. Thicknesses of second to fourth conductive layers 19b to 19d are respectively, for example, approximately 50 nm to 1 μm, approximately 50 nm to 150 nm, approximately 10 μm to 20 μm, and 1 μm to 5 μm.

Note that a method of forming first to fourth conductive layers 19a to 19d is not particularly limited, and they may be formed by a method such as a sputtering method, a thin-film forming method such as a CVD method, or a plating method, for example. Specifically, in the embodiment, first and second conductive layers 19a, 19b are films formed by a thin-film forming method, and third and fourth conductive layers 19c, 19d are films formed by a plating method.

Next, a method of manufacturing solar cell 1 according to the embodiment is described by mainly referring to FIGS. 3 to 12.

Figure 3:
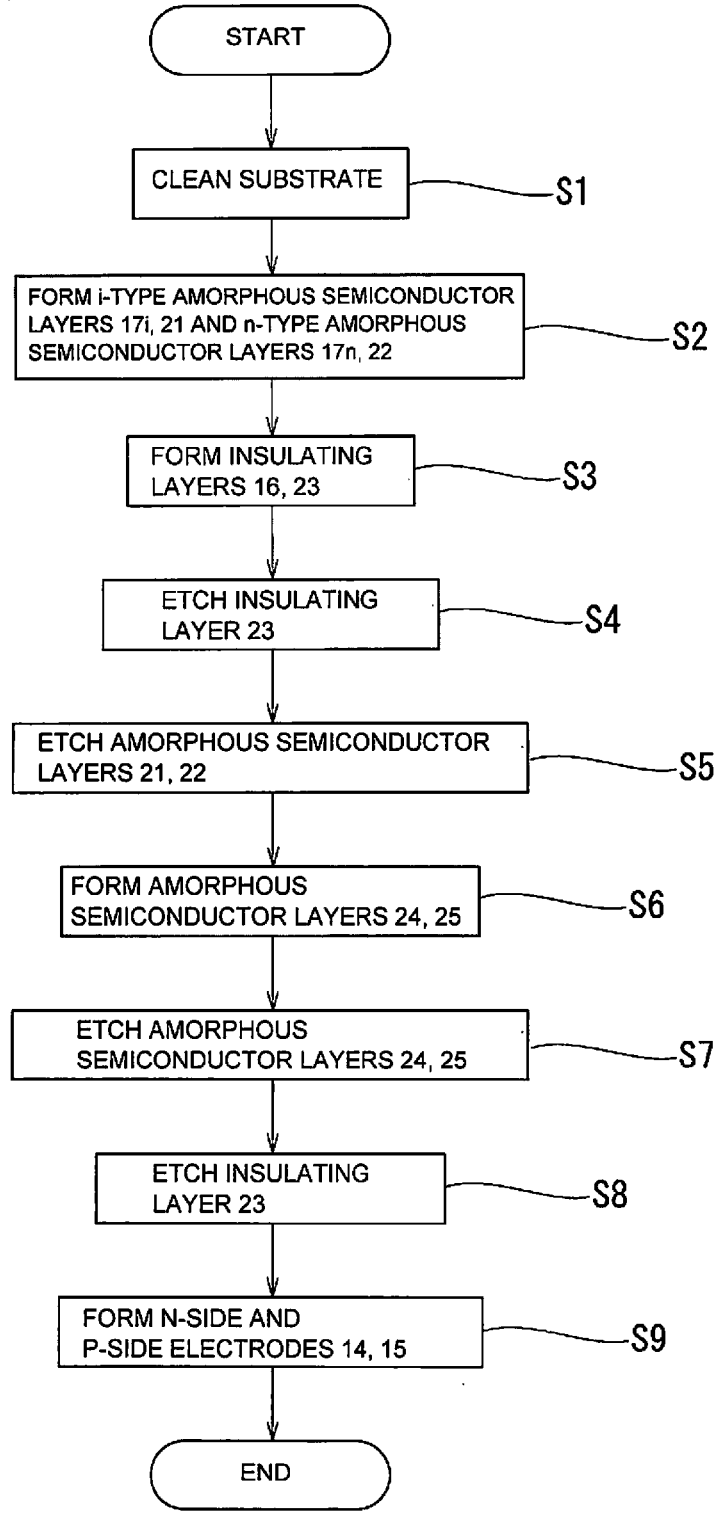
FIG. 3 is a flowchart illustrating processes of manufacturing the solar cell in the first embodiment.
Figure 4:
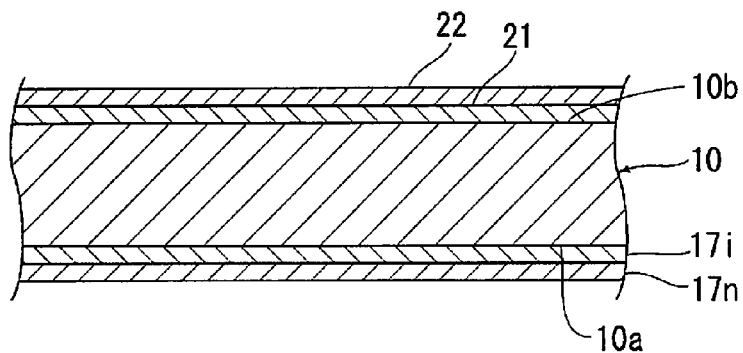
FIG. 4 is a schematic cross-sectional view for illustrating a process of manufacturing the solar cell.
Figure 5:
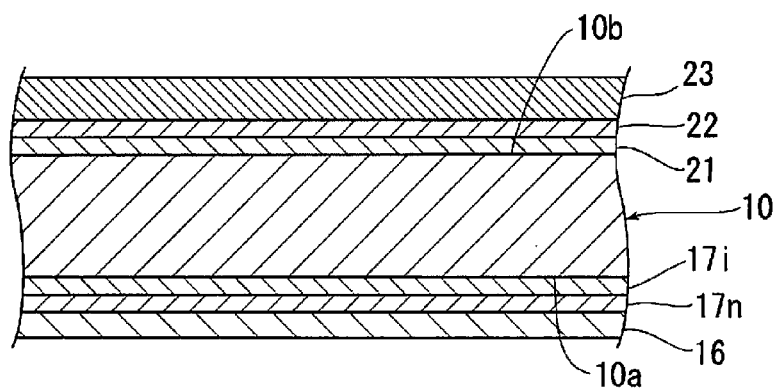
FIG. 5 is a schematic cross-sectional view for illustrating a process of manufacturing the solar cell.
Figure 6:
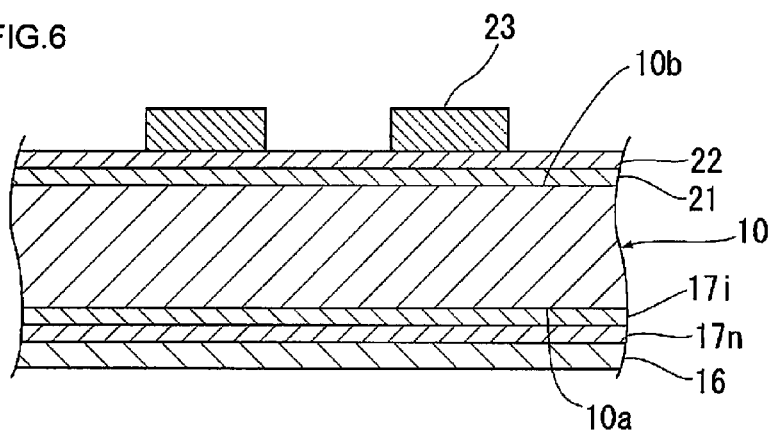
FIG. 6 is a schematic cross-sectional view for illustrating a process of manufacturing the solar cell.
Figure 7:
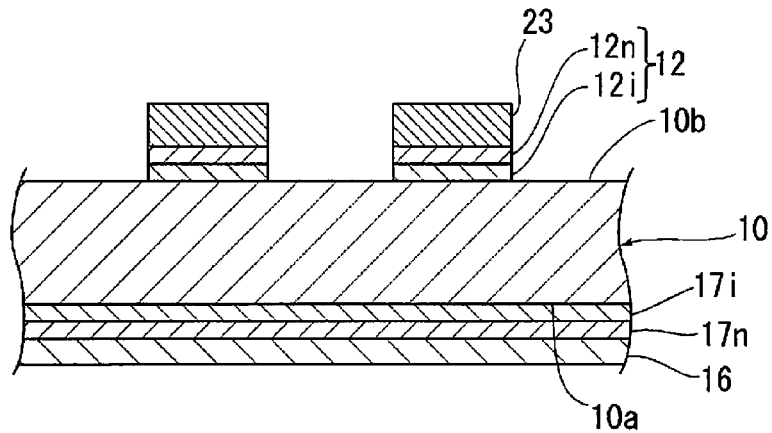
FIG. 7 is a schematic cross-sectional view for illustrating a process of manufacturing the solar cell.
Figure 8:
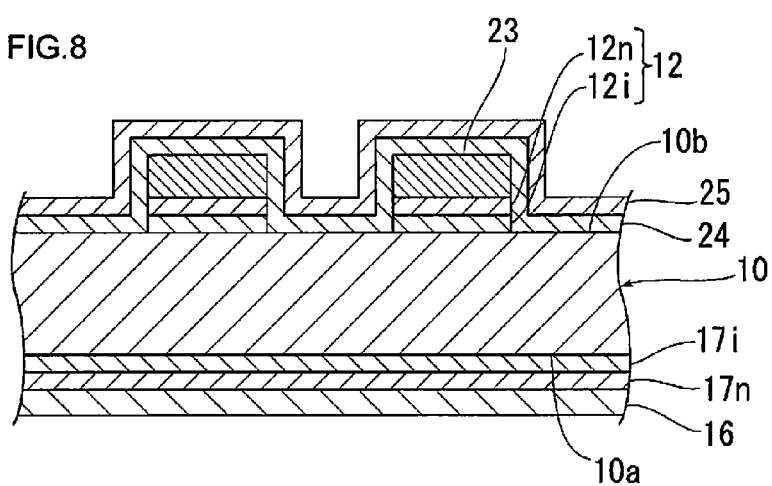
FIG. 8 is a schematic cross-sectional view for illustrating a process of manufacturing the solar cell.
Figure 9:
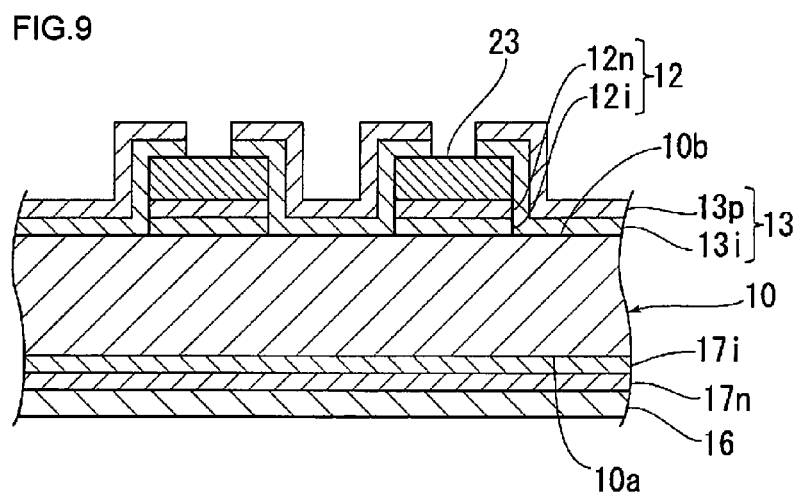
FIG. 9 is a schematic cross-sectional view for illustrating a process of manufacturing the solar cell.
Figure 10:
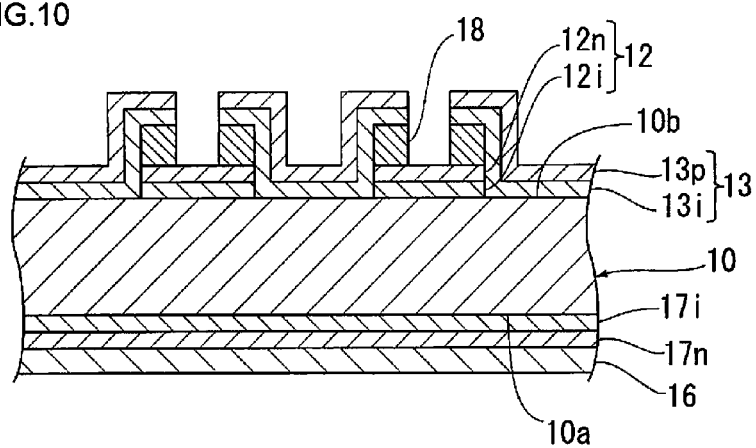
FIG. 10 is a schematic cross-sectional view for illustrating a process of manufacturing the solar cell.

First, semiconductor substrate 10 (see, FIGS. 4 and 2) is prepared. Then, as illustrated in FIG. 3, at step S1, light-receiving surface 10a and back surface 10b of semiconductor substrate 10 are cleaned. The cleaning of semiconductor substrate 10 may be performed by using, for example, HF aqueous solution. Note that it is preferable that a texture structure be formed on light-receiving surface 10a at this step S1.

Next, at step S2, i-type amorphous semiconductor layer 17i and n-type amorphous semiconductor layer 17n are formed on light-receiving surface 10a of semiconductor substrate 10, and i-type amorphous semiconductor layer 21 and n-type amorphous semiconductor layer 22 are formed on back surface 10b. A method of forming each of i-type amorphous semiconductor layers 17i, 21 and n-type amorphous semiconductor layers 17n, 22 is not particularly limited. Each of i-type amorphous semiconductor layer 17i, 21 and n-type amorphous semiconductor layer 17n, 22 may be formed of, for example, a CVD (Chemical Vapor Deposition) method such as a plasma CVD method.

Next, at step S3, insulating layer 16 is formed on n-type amorphous semiconductor layer 17n and insulating layer 23 is formed on n-type amorphous semiconductor layer 22. Note that a method of forming insulating layers 16, 23 is not particularly limited. Insulating layers 16, 23 may be formed by a sputtering method or a thin-film forming method such as a CVD method.

Next, at step S4, insulating layer 23 is etched and thereby is partially removed. Specifically, a portion of insulating layer 23 located on a region in which a p-type semiconductor layer is to be in contact with semiconductor substrate 10 in a later process. Note that insulating layer 23 may be etched by using an acid etching solution such as HF aqueous solution, for example, if insulating layer 23 is made of silicon oxide, silicon nitride, or silicon oxynitride.

Next, step S5, by using insulating layer 23 patterned at step S4 as a mask, i-type amorphous semiconductor layer 21 and n-type amorphous semiconductor layer 22 are etched by using an alkaline etching solution, so that portions of i-type amorphous semiconductor layer 21 and n-type amorphous semiconductor layer 22 other than a portion thereof covered by insulating layer 23 are removed. Accordingly, a portion of back surface 10b above which insulating layer 23 is not located is exposed and i-type amorphous semiconductor layer 12i and n-type amorphous semiconductor layer 12n (see, FIG. 2) are formed from semiconductor layers 21, 22.

Here, as described above, in the embodiment, insulating layer 23 is made of silicon oxide, silicon nitride, or silicon oxynitride. For this reason, an etching rate for insulating layer 23 by an acid etching solution is high but an etching rate for insulating layer 23 by an alkaline etching solution is low. On the other hand, semiconductor layers 21, 22 are made of amorphous silicon. For this reason, for semiconductor layers 21, 22, an etching rate by an acid etching solution is low but an etching rate by an alkaline etching solution is high. For this reason, by an acid etching solution used at step S4, insulating layer 23 is etched but semiconductor layers 21, 22 are not substantially etched. On the other hand, by an alkaline etching solution used at step S5, semiconductor layers 21, 22 are etched but insulating layer 23 is not substantially etched. Accordingly, at step S4 and step S5, insulating layer 23 and semiconductor layers 21, 22 can be selectively etched.

As described above, prepared by steps S1 to S5 is semiconductor substrate 10 in which back surface 10b as a first principle surface and light-receiving surface 10a as a second principle surface are included and n-type amorphous semiconductor layer 12n made of n-type semiconductor is formed on a portion of back surface 10b, and insulating layer 23 is further formed to cover n-type amorphous semiconductor layer 12n. In other words, prepared is semiconductor substrate 10 in which back surface 10b as a first principle surface and light-receiving surface 10a as a second principle surface are included and an n-type semiconductor region is formed on a portion of back surface 10b, and insulating layer 23 is formed to cover the n-type semiconductor region.

Next, at step S6, i-type amorphous semiconductor layer 24 and p-type amorphous semiconductor layer 25 are sequentially formed in this order to cover back surface 10b. Note that a method of forming amorphous semiconductor layers 24, 25 is not particularly limited. For example, amorphous semiconductor layers 24, 25 may be formed by a thin-film forming method such as CVD method.

Next, at step S7, each of the portions of amorphous semiconductor layers 24, 25 located on insulating layer 23 is partially etched. Accordingly, i-type amorphous semiconductor layer 13i and p-type amorphous semiconductor layer 13p are formed from amorphous semiconductor layers 24, 25.

Step S7 uses a first etchant whose etching rate is higher for amorphous semiconductor layers 24, 25 than for insulating layer 23. Accordingly, amorphous semiconductor layers 24, 25 are selectively etched among insulating layer 23 and amorphous semiconductor layers 24 and 25.

It is preferable that the first etchant be an etchant whose etching rate for amorphous semiconductor layers 24, 25 is 1.1 times or more, preferably 1.5 times or more, more preferably, 2 times or more, and even more preferably 5 times or more of an etching rate thereof for insulating layer 23. Furthermore, preferably, the first etchant etches amorphous semiconductor layers 24, 25 but does not substantially etch insulating layer 23. For example, in a case where amorphous semiconductor layers 24, 25 are made of silicon and insulating layer 23 is made of silicon oxide, silicon nitride, or silicon oxynitride, a specific example of such first etchant includes NaOH aqueous solution containing NaOH, alkaline aqueous solution such as KOH aqueous solution containing KOH, or mixed acid of nitric acid and ammonia. Also, the first etchant is not necessarily liquid, that is, etching solution. The first etchant may be, for example, gas. For example, a specific example of etching gas to be preferably used as the first etchant includes a mixed gas of $Cl_2$ and He or $XeF_2$ gas.

Note that an "etching solution" in the invention includes an etching paste in a paste form or an etching ink with its viscosity adjusted for various application techniques.

Next, at step S8, insulating layer 23 is etched. Specifically, an exposed portion of insulating layer 23 is removed by etching using a second etchant from above amorphous semiconductor layers 13i, 13p including amorphous semiconductor layers 24, 25 partially removed by etching at step S7. Accordingly, n-type amorphous semiconductor layer 12n is exposed by forming a contact hole in insulating layer 23 and insulating layer 18 is formed from insulating layer 23.

At step S8, the second etchant whose etching rate is higher for insulating layer 23 than for amorphous semiconductor layers 24, 25 is used. Accordingly, insulating layer 23 is selectively etched among insulating layer 23 and amorphous semiconductor layers 24 and 25.

It is preferable that the second etchant be an etchant whose etching rate for insulating layer 23 is 1.1 times or more, preferably 1.5 times or more, more preferably 2 times or more, and even more preferably 5 times or more of an etching rate thereof for amorphous semiconductor layers 24, 25. Furthermore, preferably, the second etchant etches insulating layer 23 but does not substantially etch amorphous semiconductor layers 24, 25. For example, in a case where amorphous semiconductor layers 24, 25 are made of silicon and insulating layer 23 is made of silicon oxide, silicon nitride, or silicon oxynitride, a specific example of such second etchant includes HF aqueous solution containing HF, or acid aqueous solution such as phosphoric acid aqueous solution. Also, the second etchant is not necessarily liquid, that is, etching solution, as similar to the first etchant. The second etchant may be, for example, gas. For example, a specific example of etching gas to be preferably used as the second etchant includes a mixed gas of $SF_6$ and He, a mixed gas of $CF_4$, $CHF_3$, and He, or He gas. Among them, HF aqueous solution is preferably used as the second etchant. This is because an oxide film on a surface on which the electrode is to be formed can be removed before forming the electrode at step S9.

Next, at step S9, an electrode forming process is performed for forming n-side electrode 14 and p-side electrode 15 on n-type amorphous semiconductor layer 12n and p-type amorphous semiconductor layer 13p, respectively, so that solar cell 1 can be completed.

A method of forming n-side electrode 14 and p-side electrode 15 may be selected as needed according to a material of the electrode. Specifically, in the embodiment, n-side electrode 14 and p-side electrode 15 are formed as follows.

Figure 11:
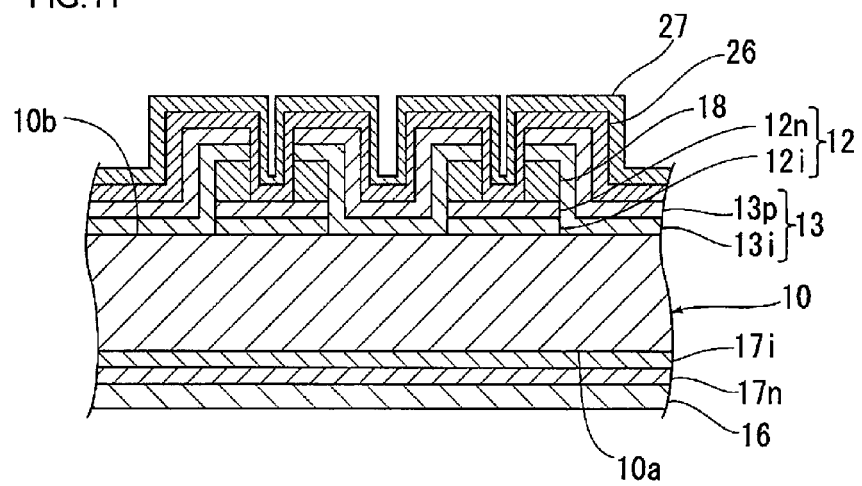
FIG. 11 is a schematic cross-sectional view for illustrating a process of manufacturing the solar cell.

First, as illustrated in FIG. 11, conductive layer 26 made of TCO and conductive layer 27 made of a metal such as Cu or an alloy are formed in this order by a CVD (Chemical Vapor Deposition) method such as a plasma CVD method or a thin-film forming method such as a sputtering method.

Figure 12:
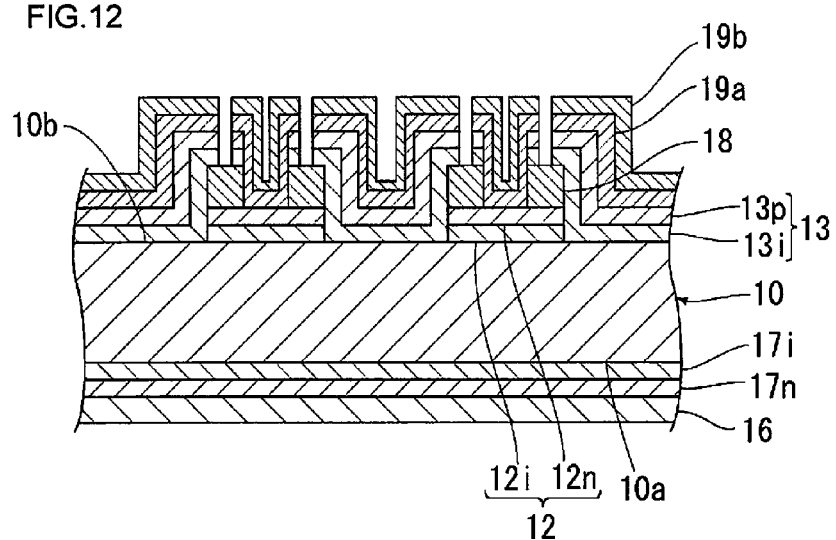
FIG. 12 is a schematic cross-sectional view for illustrating a process of manufacturing the solar cell.

Next, as illustrated in FIG. 12, conductive layers 26, 27 are separated into parts at a portion located above insulating layer 18. Accordingly, first and second conductive layers 19a, 19b are formed from conductive layers 26, 27. Note that, conductive layers 26, 27 may be separated by, for example, a photolithography method, or the like.

Next, third conductive layer 19c made of Cu and fourth conductive layer 19d made of Sn are sequentially formed by electrolytic plating on first and second conductive layers 19a, 19b formed on n-type amorphous semiconductor layer 12n and p-type amorphous semiconductor layer 13p, so that n-side electrode 14 and p-side electrode 15 illustrated in FIG. 2 can be completed.

As described above, amorphous semiconductor layer 13 has a function to form a semiconductor junction with semiconductor substrate 10 and a function as a mask layer for forming a contact hole in insulating layer 18. In other words, according to the embodiment, a semiconductor layer for forming a semiconductor junction with semiconductor substrate 10 and a mask layer for forming a contact hole are formed in the same process. Thus, a time required for manufacturing solar cell 1 can be shortened.

Also, in the embodiment, portions of amorphous semiconductor layers 24, 25 located above insulating layer 23 is partially and selectively etched by the first etchant. Then, by using etched amorphous semiconductor layer 24 as a mask, a portion of insulating layer 23 is removed by etching with the second etchant to expose n-type amorphous semiconductor layer 12n. For this reason, for example, unlike a case where insulating layer 23 covered with amorphous semiconductor layers 24, 25 is removed by etching using an etchant capable of etching insulating layer 23 to expose n-type amorphous semiconductor layer 12n, insulating layer 23 and amorphous semiconductor layers 24, 25 can be quickly and easily etched. In practice, a time required for etching insulating layer 23 and amorphous semiconductor layers 24, 25 by the method according to the embodiment is approximately one seventh to one twelfth of a time required for removing insulating layer 23 that is covered with amorphous semiconductor layers 24 and 25 by etching with HF capable of etching insulating layer 23. Accordingly, solar cell 1 can be easily manufactured in a shorter manufacturing time.

Note that, for example, it is also possible that insulating layer 23 and amorphous semiconductor layers 24, 25 are etched at the same time by using one kind of etchant so that n-type amorphous semiconductor layer 12n can be exposed. However, in general, an etchant capable of etching amorphous semiconductor layers 24, 25 can also etch amorphous semiconductor layers 12i, 12n. For this reason, insulating layer 23 and amorphous semiconductor layers 24, 25 are tried to be etched at the same time using one kind of etchant, which results in etching amorphous semiconductor layers 12i, 12n under insulating layer 23. Accordingly, only by using the first and second etchants capable of selectively etching as in the embodiment, n-type amorphous semiconductor layer 12n can be exposed by etching and removing the portions of insulating layer 23 and amorphous semiconductor layers 24 and 25.

In the embodiment, insulating layer 23 is formed of silicon oxide, silicon nitride, or silicon oxynitride. For this reason, insulating layer 18 formed of insulating layer 23 has a high gas barrier property. Thus, solar cell 1 with excellent weather-resistance can be manufactured. From a viewpoint to achieve better weather-resistance, it is preferable that insulating layer 23 be formed of silicon nitride.

Also, in the case where insulating layer 23 contains hydrogen, solubility of insulating layer 23 with an acid etching solution is high. Accordingly, the selective of etching insulating layer 23 can be increased. Accordingly, damages to n-type amorphous semiconductor layer 12n and p-type amorphous semiconductor layer 13p can be suppressed at the time of etching insulating layer 23. As a result, solar cell 1 with better photoelectric conversion efficiency can be manufactured.

In the embodiment, insulating layer 18 is formed on n-type amorphous semiconductor layer 12n among n-type amorphous semiconductor layer 12n and p-type amorphous semiconductor layer 13p. In other words, a semiconductor layer located under insulating layer 18 is used as n-type amorphous semiconductor layer 12n. Then, p-side electrode 15 is formed substantially entirely on p-type amorphous semiconductor layer 13p. For this reason, holes which are minority carriers can be easily collected to p-side electrode 15. Accordingly, the photoelectric conversion efficiency of obtainable solar cell 1 can be increased.

However, when the semiconductor substrate has a p-type conductivity, minority carriers become electrodes. Thus, it is preferable that the first semiconductor layer located under the insulating layer be formed of a p-type semiconductor layer.

In addition, in the embodiment, p-type amorphous semiconductor layer 13p is formed so that back surface 10b of semiconductor substrate 10 made of crystalline semiconductor is substantially entirely covered with n-type amorphous semiconductor layer 12n and p-type amorphous semiconductor layer 13p. Accordingly, back surface 10b of semiconductor substrate 10 made of crystalline semiconductor is not substantially exposed. Thus, holes which are minority carriers of semiconductor substrate 10 are unlikely to be recombined on back surface 10b. Accordingly, the photoelectric conversion efficiency of obtainable solar cell 1 can be further increased.

In the embodiment, third and fourth conductive layers 19c, 19d are formed by plating after first and second conductive layers 19a, 19b formed by a thin film forming are separated. For this reason, for example, as compared with a case where n-side electrode 14 and p-side electrode 15 are separated after all of first to fourth conductive layers 19a to 19d are formed, separation of electrodes can be easily made in a shorter period of time.

Also, since the separation of first and second conductive layers 19a, 19b is performed on insulating layer 18, n-type amorphous semiconductor layer 12n and p-type amorphous semiconductor layer 13p are unlikely to be damaged at the time of separating first and second conductive layers 19a, 19b.

Also, in the embodiment, insulating layer 18, n-side electrode 14, and p-side electrode 15 are formed so that n-type amorphous semiconductor layer 12n and p-type amorphous semiconductor layer 13p are substantially entirely covered with insulating layer 18, n-side electrode 14, and p-side electrode 15. Therefore, according to the manufacturing method of the embodiment, solar cell 1 with more excellent gas barrier property and weather-resistance can be manufactured.

Hereinafter, another example of preferable embodiments implementing the invention is described. Note that, in the following description, common reference numerals are referred to members having functions substantially common with those of the first embodiment.

(Second Embodiment)

Figure 13:
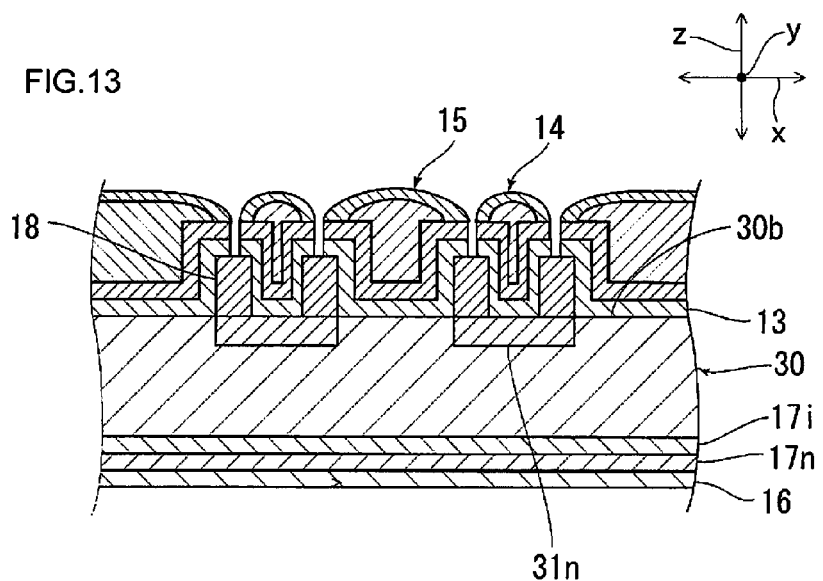
FIG. 13 is a schematic cross-sectional view of a solar cell according to a second embodiment.
Figure 14:
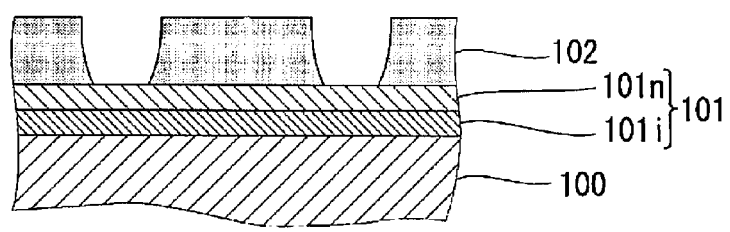
FIG. 14 is a schematic cross-sectional view for illustrating a process of manufacturing a solar cell as set forth in Patent document 1.
Figure 15:
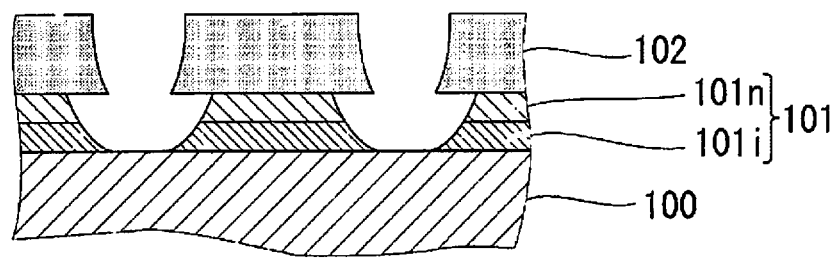
FIG. 15 is a schematic cross-sectional view for illustrating a process of manufacturing the solar cell as set forth in Patent document 1.
Figure 16:
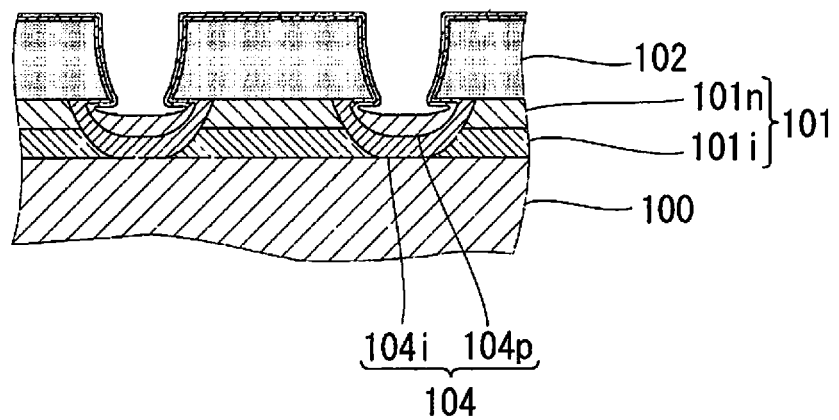
FIG. 16 is a schematic cross-sectional view for illustrating a process of manufacturing the solar cell as set forth in Patent document 1.

FIG. 13 is a schematic cross-sectional view of a solar cell according to a second embodiment.

As illustrated in FIG. 2, described in the first embodiment is an example where a crystalline semiconductor substrate having an n-type conductivity is used as semiconductor substrate 10 and n-type amorphous semiconductor layer 12n is formed on semiconductor substrate 10. However, the invention is not limited to this configuration.

For example, as illustrated in FIG. 13, n-type dopant may be thermally diffused to a part of a portion of n-type crystalline semiconductor substrate 30 on a back surface 30b side, so that $n^+$-type thermal diffusion region 31n is formed in a portion of back surface 30b of crystalline semiconductor substrate 30.

Even in the embodiment, as similar to the first embodiment, a solar cell is completed by performing steps S6 to S9 as illustrated in FIG. 3 after n+-type thermal diffusion region 31n is formed.

EXPLANATION OF THE REFERENCE NUMERALS

1 . . . solar cell
10 . . . semiconductor substrate
10a . . . light-receiving surface
10b . . . back surface
11 . . . light
12 . . . IN laminate
12i . . . i-type amorphous semiconductor layer
12n . . . n-type amorphous semiconductor layer
13 . . . IP laminate
13i . . . i-type amorphous semiconductor layer
13p . . . p-type amorphous semiconductor layer
14 . . . n-side electrode
15 . . . p-side electrode
16 . . . insulating layer
17i . . . i-type amorphous semiconductor layer
17n . . . n-type amorphous semiconductor layer
18 . . . insulating layer
19a . . . first conductive layer
19b . . . second conductive layer
19c . . . third conductive layer
19d . . . fourth conductive layer
21 . . . i-type amorphous semiconductor layer
22 . . . n-type amorphous semiconductor layer
23 . . . insulating layer
24 . . . i-type amorphous semiconductor layer
25 . . . p-type amorphous semiconductor layer
26, 27 . . . conductive layer
30 . . . n-type crystalline semiconductor substrate
30b . . . back surface
31n . . . n+-type thermal diffusion region

The invention claimed is:

1. A method of manufacturing a solar cell, comprising:
preparing a semiconductor substrate having first and second principle surfaces,
forming a first amorphous semiconductor layer having a first conductivity on a portion of the first principle surface,
forming an insulating layer of silicon nitride, silicon oxide or silicon oxynitride covering the first amorphous semiconductor layer;
then forming a second amorphous semiconductor layer having a second conductivity to cover the first principle surface including a surface of the insulating layer;
partially removing a portion of the second semiconductor layer located on the insulating layer by etching using a first etchant whose etching rate is higher for the second semiconductor layer than for the insulating layer;
exposing the first amorphous semiconductor layer by removing a portion of the insulating layer by etching using the second semiconductor layer partially removed by the etching as a mask and using a second etchant whose etching rate is higher for the insulating layer than for the second semiconductor layer; and after exposing the first amorphous semiconductor layer,
then forming an electrode on each of the first semiconductor layer and the second semiconductor layer.

2. The method of manufacturing a solar cell according to claim 1, wherein a semiconductor substrate having the first conductivity is used as the semiconductor substrate.

3. The method of manufacturing a solar cell according to claim 1, wherein a crystalline semiconductor substrate is used as the semiconductor substrate.

4. The method of manufacturing a solar cell according to claim 1, wherein the second semiconductor layer is formed to cover substantially the entire of the first principle surface of the semiconductor substrate with the first semiconductor layer and the second semiconductor layer.

5. The method of manufacturing a solar cell according to claim 1, wherein the insulating layer contains hydrogen.

6. The method of manufacturing a solar cell according to claim 1, wherein an alkaline etching solution is used as the first etchant and an acid etching solution is used as the second etchant.

7. The method of manufacturing a solar cell according to claim 6, wherein at least one of NaOH aqueous solution and KOH aqueous solution is used as the first etchant and HF aqueous solution is used as the second etchant.

8. The method of manufacturing a solar cell according to claim 1, wherein the electrode forming step comprises:
forming a first conductive layer on the first semiconductor layer, the second semiconductor layer, and the insulating layer;
insulating a portion of the first conductive layer formed on the first semiconductor layer and a portion of the first conductive layer formed on the second semiconductor layer from each other by dividing the first conductive layer at a portion located on the insulating layer; and after exposing the first amorphous semiconductor laver,
then forming a first electrode electrically connected with the first semiconductor layer and a second electrode electrically connected with the second semiconductor layer by forming a second conductive layer on each of the portion of the first conductive layer formed on the first semiconductor layer and the portion of the first conductive layer formed on the second semiconductor layer.

9. A method of manufacturing a solar cell, comprising:
preparing a semiconductor substrate having first and second principle surfaces,
forming a first amorphous semiconductor layer having a first conductivity on a portion of the first principle surface,
forming an insulating layer of silicon nitride, silicon oxide or silicon oxynitride covering the first amorphous semiconductor layer;
then forming a second amorphous semiconductor layer having a second conductivity to cover the first principle surface including a surface of the insulating layer;
partially removing a portion of the second semiconductor layer located on the insulating layer;
exposing the first amorphous semiconductor layer by removing a portion of the insulating layer by etching using the second semiconductor layer partially removed by the etching as a mask and using a second etchant whose etching rate is higher for the insulating layer than for the second semiconductor layer; and after exposing the first amorphous semiconductor layer,
then forming an electrode on each of the first semiconductor layer and the second semiconductor layer.

* * * * *